(12) United States Patent
Sim et al.

(10) Patent No.: US 6,326,815 B1
(45) Date of Patent: Dec. 4, 2001

(54) SENSE AMPLIFIER OF SEMICONDUCTOR INTEGRATED CIRCUIT

(75) Inventors: Jae-yoon Sim, Suwon; Hyun-soon Jang, Seoul; Woo-seop Jeong, Yongin; Kyung-ho Kim, Suwon, all of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/547,987

(22) Filed: Apr. 12, 2000

(30) Foreign Application Priority Data

Jul. 10, 1999 (KR) .................................... 99-27890

(51) Int. Cl.[7] ............................. G01R 19/00; G11C 7/00; H03F 3/45
(52) U.S. Cl. ............................... 327/57; 327/51; 327/52; 327/55; 327/65; 327/200; 330/253; 330/258; 365/207
(58) Field of Search ................................. 327/50–55, 57, 327/63–66, 563, 197–200, 202, 203; 365/205–208; 330/253, 258

(56) References Cited

U.S. PATENT DOCUMENTS

| | | | |
|---|---|---|---|
| 5,276,369 | * | 1/1994 | Hayakawa et al. ..................... 327/51 |
| 5,331,233 | * | 7/1994 | Urakawa ................................ 327/52 |
| 5,347,183 | * | 9/1994 | Phelan .................................. 327/52 |
| 5,654,928 | * | 8/1997 | Lee et al. ............................... 327/57 |
| 5,939,904 | * | 8/1999 | Fetterman et al. ...................... 327/65 |
| 6,037,807 | * | 3/2000 | Wu et al. ............................... 327/52 |

* cited by examiner

*Primary Examiner*—Terry D. Cunningham
*Assistant Examiner*—Long Nguyen

(57) ABSTRACT

A semiconductor integrated circuit includes a sense amplifier for amplifying an input signal and a complementary input signal, a full differential amplifier for amplifying the output of the sense amplifier, and a latch for latching the output of the full differential amplifier and outputting the latched output. The full differential amplifier includes a first differential amplifying unit for increasing the voltage of an output port when the level of an input signal input through an input port is larger than the level of an complementary input signal input through an complementary input port and reducing the voltage of the output port when the level of the input signal is lower than the level of the complementary input signal, a second differential amplifying unit for reducing the voltage of an complementary output port when the level of the input signal is larger than the level of the complementary input signal and increasing the voltage of the complementary output port when the level of the input signal is lower than the level of the complementary input signal, and an output voltage level control circuit connected between the output port and the complementary output port. The output voltage level control circuit controls the voltage levels of the output signals output from the output port and the complementary output port. The sense amplifier can stabilize the operation of the latch by reducing the mean voltage level of the output signal even when the supply A voltage increases, can easily control the voltage gain of the full differential amplifier by controlling the resistance, and stably operates at high speed. The current sense amplifier can include resistors associated with PMOS transistors to avoid unstable operation caused by increased transconductance arising from higher operating voltage.

32 Claims, 12 Drawing Sheets

(a)

(b)

SENSE AMPLIFIER OF SEMICONDUCTOR INTEGRATED CIRCUIT

BACKGROUND OF THE INVENTION

1. Field of the Invention

The present invention relates to semiconductor integrated circuits, and more particularly, to sense amplifiers and differential amplifiers.

2. Description of the Related Art

There are two types of sense amplifiers commonly used for amplifying signals in semiconductor integrated circuits, current sense amplifiers and voltage sense amplifiers. Current sense amplifiers are widely used since they can operate faster than voltage sense amplifiers. FIG. 1 shows a conventional sense amplifier circuit that includes a current sense amplifier 10, a full differential amplifier 12, and a latch 14. When an enable signal EN is at a high level, NMOS transistors MN11, MN5, and MN8 are on and provide current paths to enable operation of the current amplifier 10, the full differential amplifier 12, and the latch 14, respectively. During a sensing time when the enable signal EN is at a high level, the voltage swings of the output signals SAOUT and SAOUTB of the current sense amplifier 10 are small. Accordingly, the amplification speed of the current sense amplifier 10 cannot directly convert the output signals SAOUT and SAOUTB to a CMOS voltage level. To increase the amplification speed, the full differential amplifier 12 further amplifies the output signal of the current sense amplifier 10 and outputs the amplified signals OUT and OUTB to the latch 14. The latch 14 latches the output signals OUT and OUTB from the full differential amplifier 12 and provides latched output signals DOUT and DOUTB.

In differential amplifier 12, a first NMOS transistor MN1, a second NMOS transistor MN2, a first PMOS transistor MP1, and a second PMOS transistor NMP operate as a first differential amplifying unit that generates the output signal OUT. When the voltage of an input signal SAOUT input through node 16 functioning as an input port becomes higher than the voltage of a complementary input signal SAOUTB input through node 18 functioning as a complementary input port, the voltage of the output signal OUT at an output port 24 increases. A third NMOS transistor MN3, a fourth NMOS transistor MN4, a third PMOS transistor MP3, and a fourth PMOS transistor MP4 operate as a second differential amplifying unit that generates the complementary output signal OUTB. Accordingly, the voltage of the complementary output signal OUTB at a complementary output port 26 decreases when the voltage of the input signal SAOUT becomes higher than that of the complementary input signal SAOUTB.

When the voltage of the input signal SAOUT becomes lower than the voltage of the complementary input signal SAOUTB, the first differential amplifying unit decreases the voltage of the output signal OUT, and the second differential amplifying unit increases the voltage of the complementary signal OUTB. The voltage difference between the output signal OUT and the complementary output signal OUTB is proportionate to the voltage difference between the input signal IN and the complementary input signal INB.

The output signal OUT and the complementary output signal OUTB are the input signals of the latch 14. The latch 14 includes a sixth NMOS transistor MN6, a seventh NMOS transistor MN7, an eighth NMOS transistor MN8, a fifth PMOS transistor MP5, and a sixth PMOS transistor MP6. The latch 14 performs an effective latch operation when the voltage levels of the output signal OUT and the complementary output signal OUTB from the full differential amplifier 12 near the turn-on voltage of the NMOS transistors MN6 and MN7, respectively. If either the output signal OUT or the complementary output signal OUTB is higher than the turn-on voltage of the corresponding NMOS transistor MN6 or MN7, the latch 14 performs the latch operation when the other signal OUTB or OUT is lower than the turn-off voltage of the corresponding NMOS transistor MN7 or MN6. In FIG. 1, the latch circuit 14 outputs the output signal DOUT and the complementary output signal DOUTB.

In general, transistors in the sense amplifier of FIG. 1 are sized so that when a supply voltage VDD is low, the mean value of the output signal OUT and the complementary output signal OUTB is around the turn-on voltage of the NMOS transistors MN6 and MN7. However, the channel length modulation effect of the PMOS transistors (e.g., transistors MP1, MP2, MP3, and MP4) becomes larger than the channel length modulation effect of the NMOS transistors (e.g., MN1, MN2, MN3, and MN4) as the supply voltage VDD increases. Accordingly, when the supply voltage VDD increases, the mean voltage of the output signal OUT and the complementary output signal OUTB increases. Accordingly, the NMOS transistors MN6 and MN7 in the latch 14 do not operate effectively. More specifically, the output signal OUT, which is applied to the gate of the sixth NMOS transistor MN6, and the complementary output signal OUTB, which is applied to the gate of the seventh NMOS transistor MN7, strongly turn on transistors MN6 and MN7. This can cause errors in the latch operation. Accordingly, the latch circuit 14 can malfunction when the semiconductor integrated circuit is tested in a high voltage test enable (HITE) mode, where the supply voltage is a high voltage. Therefore, normal testing of the semiconductor integrated circuit in the HITE mode is not possible.

To solve the above problem, the design of the full differential amplifier 12 can make the second PMOS transistor MP2 and the third PMOS transistor MP3 smaller. In this case, the gain of the full differential amplifier is reduced.

The current sense amplifier 10 shown in FIG. 1 is widely used since the current sense amplifier 10 operates faster than a voltage sense amplifier. However, the operation of the current sense amplifier 10 becomes unstable since a positive feedback circuit is used to effectively receive a current input signal. For the current sense amplifier 10, reference numerals I1 and I2 denote current signals input through the input ports 15 and 17, respectively. Signals SAOUT and SAOUTB are output through node 16 functioning as an output port and node 18 functioning as a complementary output port, respectively.

To explain the operation of the current sense amplifier 10, the transconductance of the ninth NMOS transistor MN9 and the tenth NMOS transistor MN10 is referred to herein as gmn. The transconductance of the seventh PMOS transistor MP7 and the eighth PMOS transistor MP8 is referred to as gmp. $\Delta I$ is the difference between the input current I1 and the complementary input current I2 ($\Delta I = I1 - I2$). The voltage difference between the output voltage SAOUT and the complementary output voltage SAOUTB is about equal to $\Delta I / gmn$. The difference between the current value amplified by the seventh PMOS transistor MP7 and the current value amplified by the eighth PMOS transistor MP8 is $\Delta I \times gmp / gmn$. Since this value must be equal to $\Delta I$, which is the difference between the input current signals I1 and I2, the transconductance gmp of the PMOS transistors MP7 and MP8 must be equal to the transconductance gmn of the NMOS transistors MN9 and MN10.

When the sizes of the seventh PMOS transistor MP7 and the eighth PMOS transistor MP8 are increased to increase the gains of the seventh PMOS transistor MP7 and the eighth PMOS transistor MP8, transconductance gmp becomes larger than transconductance gmn. Accordingly, the seventh PMOS transistor MP7 and the eighth PMOS transistor MP8 amplify the input current signals with a current difference larger than ΔI, which is the difference between the input current signals. Therefore, the values associated with the input current signals I1 and I2 can be exchanged, and the current sense amplifier 10 goes to an unstable state. The transconductance gmp must be less than or equal to transconductance gmn for stability. However, as transconductance gmp becomes smaller than transconductance gmn, the operation speed is reduced since the efficiency of the current sense amplifier sensing the current deteriorates. Therefore, the values of transconductances gmn and gmp must be determined considering a trade-off between stability and speed.

In general, since the channel length modulation effect of the PMOS transistor is larger than the channel length modulation effect of the NMOS transistor, the transconductance of the PMOS transistor is larger than the transconductance of the NMOS transistor.

FIG. 2 shows an NMOS diode and a PMOS diode for illustrating the transconductances of an NMOS transistor and a PMOS transistor, respectively. The transistors have gates and drains connected to form of diodes. The current-voltage characteristic curves of the transistor diodes shown in FIG. 2 are shown in FIG. 3. The slopes of the current-voltage characteristic curves indicate the transconductances at different voltages.

As shown in FIG. 3, at gate-source voltages Vgsn and Vsgp larger than a voltage Vc, the slope of the current-voltage characteristic curve of the PMOS transistor is larger than the slope of the current-voltage characteristic curve of the NMOS transistor. The transconductance gmp becomes larger than the transconductance gmn as the applied voltage increases. In the conventional current sense amplifier, when the transconductance gmp of a PMOS transistor is equal to the transconductance gmn of an NMOS transistor at a low voltage, the transconductance gmp of the PMOS transistor becomes larger than the transconductance gmn of the NMOS transistor as the supply voltage increases. Therefore, the operation of the current sense amplifier becomes unstable.

SUMMARY OF THE INVENTION

In accordance with an aspect of the present invention, a sense amplifier of a semiconductor integrated circuit includes a full differential amplifier capable of stabilizing the operation of a latch circuit and easily controlling voltage gain by reducing the mean voltage level of an output signal even when a supply voltage increases.

Another aspect of the present invention provides a current sense amplifier that stably operates at high speed.

In one embodiment of the invention, a semiconductor integrated circuit includes a sense amplifier that receives and amplifies complementary input signals, a full differential amplifier that amplifies the output of the sense amplifier, and a latch that latches the output of the full differential amplifier. The full differential amplifier includes a first differential amplifying unit, a second differential amplifying unit, and an output voltage level control circuit. The first differential amplifying unit increases the voltage of a first output port when the level of an input signal input through a first input port becomes higher than the level of a complementary input signal input through a first complementary input port and decreases the voltage of the first output port when the level of the input signal becomes lower than the level of the complementary input signal. The second differential amplifying unit decreases the voltage of a first complementary output port when the level of the input signal becomes higher than the level of the complementary input signal and increases the voltage of the first complementary output port when the level of the input signal becomes lower than the level of the first complementary input signal. The output voltage level control circuit is connected between the first output port and the first complementary output port and controls the voltage levels of the signals output from the first output port and the first complementary output port.

The output voltage level control circuit preferably includes an output voltage mean value sensing unit and an output voltage mean value controller. The output voltage mean value sensing unit senses the mean value of the voltage levels of the signals output from the first output port and the first complementary output port, and the output voltage mean value controller prevents the mean value of the output voltage levels from increasing beyond a predetermined limit. The output voltage mean value sensing unit preferably includes a first resistor and a second resistor serially connected between the first output port and the first complementary output port, and the mean value of the output voltage levels is output from a node between the first resistor and the second resistor. The resistance of the first resistor is preferably equal to the resistance of the second resistor. One embodiment of the output voltage mean value controller includes an NMOS transistor, wherein the gate and the drain of the NMOS transistor are connected to the node between the first resistor and the second resistor, and the source of the NMOS transistor is grounded.

Another embodiment of the output voltage mean value controller preferably includes a first NMOS transistor and a second NMOS transistor. The gate of the first NMOS transistor and the gate of the second NMOS transistor are connected to the node between the first resistor and the second resistor. The drain of the first NMOS transistor is connected to the first output port, and the drain of the second NMOS transistor is connected to the first complementary output port. The sources of the first NMOS transistor and the second NMOS transistor are grounded.

Preferably, the full differential amplifier further includes an operation controller connected to the first differential amplifying unit, the second differential amplifying unit, and the output voltage level control circuit. The operation controller controls the operation of the first differential amplifying unit, the second differential amplifying unit, and the output voltage level control circuit according to an enable signal.

In an exemplary embodiment, the first differential amplifying unit includes first and second PMOS transistors and first and second NMOS transistors. A supply voltage is applied to the sources of the first and second PMOS transistors. The drain and the gate of the first PMOS transistor are connected. The gate of the second PMOS transistor is connected to the gate of the first PMOS transistor, and the drain of the second PMOS transistor is connected to the first output port. The gate of the first NMOS transistor is connected to the first input port, and the drain of the first NMOS transistor is connected to the drain of the first PMOS transistor. The gate of the second NMOS transistor is connected to the first complementary input port, and the drain of the second NMOS transistor is connected to the first output port. The second differential amplifying unit includes third and fourth PMOS transistors and third and fourth NMOS transistors. The supply voltage is applied to the sources of the third and fourth PMOS transistors. The drain of the third PMOS transistor is connected to the first complementary output port. The drain and the gate of the fourth PMOS transistor are connected to the gate of the third PMOS transistor. The gate of the third NMOS transistor is connected to the first input port, and the drain of the third NMOS transistor is connected to the first complementary output. The drain of the fourth NMOS transistor is connected to the drain of the fourth PMOS transistor, and the gate of the fourth NMOS transistor is connected to the first complementary input port. The operation controller includes a fifth NMOS transistor wherein the drain of the fifth NMOS transistor is connected to the sources of the first, second, third, and fourth NMOS transistors and the output voltage mean value controller.

The sense amplifier includes: a second input port; a second complementary input port; first, second, third, and fourth transistors; and first and second resistors. The second input port receives a first current signal, and the second complementary input port receives a second current signal. The first and second transistors, which are cross coupled to each other, receive current signals from the second input port and the second complementary input port, respectively, and output a first output signal and a second output signal, respectively, to a second output port and a second complementary output port, respectively. The third and fourth transistors supply current to the second output port and the second complementary output port, respectively. The first resistor is between the second input port and the first transistor, and a second resistor is between the second complementary input port and the second transistor. The first resistor and the second resistor are preferably as close as possible to the first transistor and the second transistor, respectively.

Preferably, the sense amplifier further includes a fifth transistor that forms a current path so that the third transistor and the fourth transistor operate in response to an enable signal. The third transistor and the fourth transistor of the sense amplifier are preferably connected to each other to form diodes. The first transistor and the second transistor are preferably PMOS transistors, and the third transistor, the fourth transistor, and the fifth transistor are preferably NMOS transistors.

The first resistor can be directly formed in the first transistor by forming one contact to the source electrode of the first transistor and forming multiple contacts to the drain electrode of the first transistor, so that the contact resistance of the source electrode of the first transistor provides the resistance associated with the first resistor. Similarly, the second resistor can be directly formed in the second transistor by forming one contact to the source electrode of the second transistor and forming multiple contacts to the drain electrode of the second transistor, so that the contact resistance of the source electrode of the second transistor provides the resistance of the second resistor.

Alternatively, the first resistor is directly formed in the first transistor by having the contact of the source electrode of the first transistor separated from the gate electrode of the first transistor so that the resistance of the source electrode provides the resistance of the first resistor. Similarly, the second resistor can be directly formed in the second transistor by having the contact of the source electrode of the second transistor separated from the gate electrode of the second transistor so that the resistance of the source electrode provides the resistance of the second resistor.

In another alternative, the first resistor can be directly formed in the first transistor by forming a shallow active region for the source electrode of the first transistor so that the active resistance of the source electrode is equal to the resistance of the first resistor. The second resistor is directly formed in the second transistor by forming a shallow active region for the source electrode of the second transistor so that the active resistance of the source is equal to the resistance of the second resistor.

In yet another alternative, the first resistor can be directly formed in the first transistor having a low dopant density for the source of the first transistor so that the active resistance associated with the source of the first transistor provides the resistance of the first resistor. Similarly, the second resistor can be directly formed in the second transistor having a low dopant density for the source of the second transistor so that the active resistance associated with the source of the second transistor provides the resistance of the second resistor.

In accordance with another embodiment of the invention, a full differential amplifier includes a first differential amplifying unit, a second differential amplifying unit, and an output voltage level control circuit. The first differential amplifying unit increases the voltage of a first output port when the level of an input signal input through a first input port becomes higher than the level of a complementary input signal input through a first complementary input port and reduces the voltage of the first output port when the level of the input signal becomes lower than the level of the complementary input signal. The second differential amplifying unit reduces the voltage of a first complementary output port when the level of the input signal becomes higher than the level of the complementary input signal and increases the voltage of the first complementary output port when the level of the input signal becomes lower than the level of the first complementary input signal. The output voltage level control circuit, which is between the first output port and the first complementary output port, controls the mean voltage level of the output signals from the first output port and the first complementary output port.

In accordance with another embodiment of the invention, a current sense amplifier includes a first input port for receiving a first current signal and a first complementary input port for receiving a second current signal. A first transistor and a second transistor, which are cross coupled to each other, receive the current signals from the first input port and the first complementary input port and output a first output signal and a second output signal to a first output port and a first complementary output port. A third transistor and a fourth transistor supply current to the first output port and the first complementary output port. The current sense amplifier further includes a first resistor serially connected between the first input port and the first transistor and a second resistor serially connected between the first complementary input port and the second transistor.

BRIEF DESCRIPTION OF THE DRAWINGS

The aspects and advantages of the present invention will become more apparent by describing in detail exemplary embodiments thereof with reference to the attached drawings in which.

DESCRIPTION OF THE PREFERRED EMBODIMENTS

Figure 4:
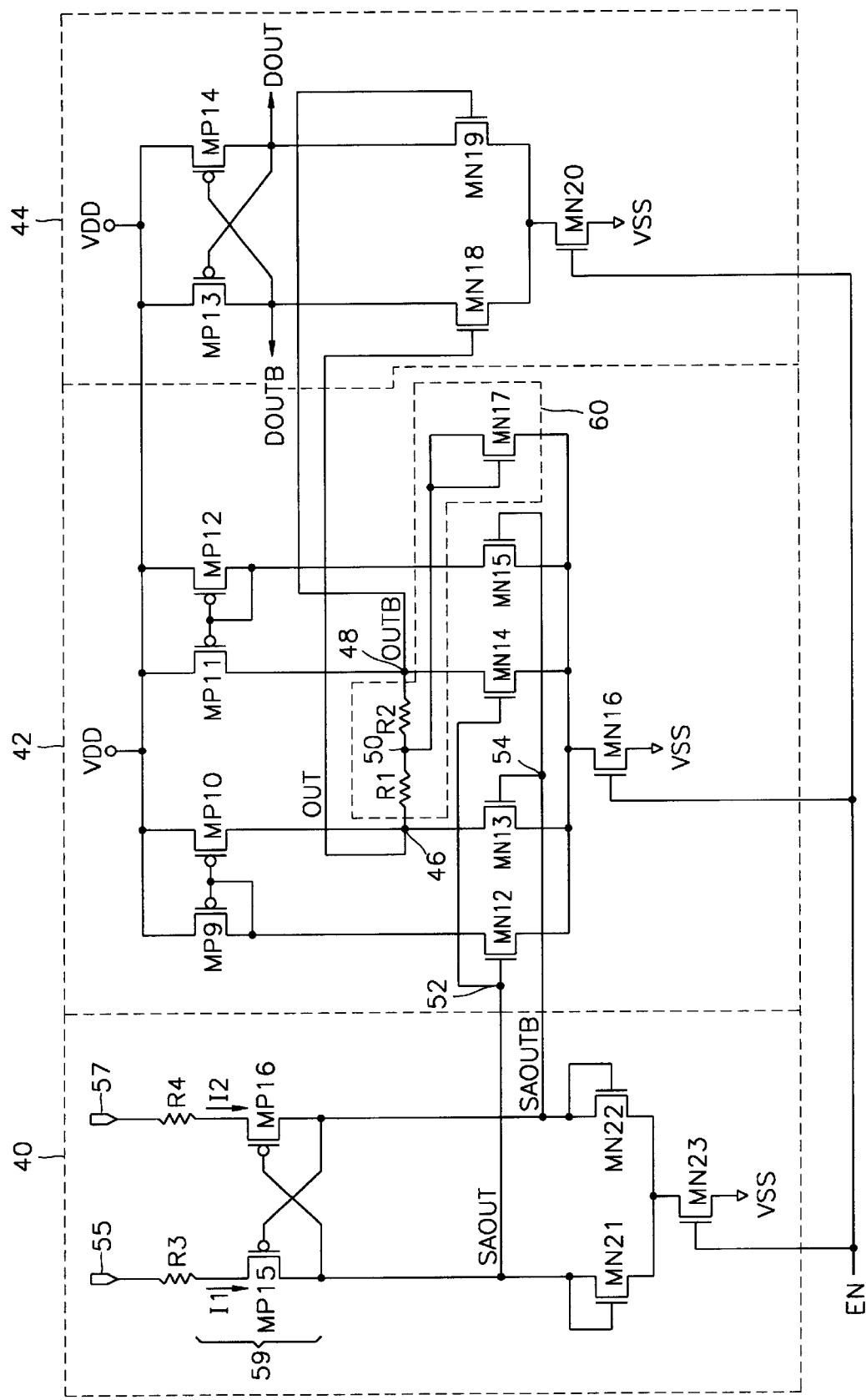
FIG. 4 shows a sense amplifier of a semiconductor integrated circuit according to an embodiment of the present invention.

FIG. 4 shows a sense amplifier of a semiconductor integrated circuit according to an embodiment of the present invention. The sense amplifier includes a current sense amplifier 40, a full differential amplifier 42 for amplifying the output of the current sense amplifier 40, and a latch 44 for latching the output of the full differential amplifier 42 and outputting the latched output.

In FIG. 4, the full differential amplifier 42 includes a first differential amplifying unit, a second differential amplifying unit, and an output voltage level control circuit 60. The first differential amplifying unit includes a first PMOS transistor MP9, a second PMOS transistor MP10, a first NMOS transistor MN12, and a second NMOS transistor MN13. The second differential amplifying unit includes a third PMOS transistor MP11, a fourth PMOS transistor MP12, a third NMOS transistor MN14, and a fourth NMOS transistor MN15. A fifth NMOS transistor MN16 turns on or off to enable or disable the first and second differential amplifying units and the output voltage level control circuit 60. The output voltage level control circuit 60 includes a first resistor R1, a second resistor R2, and a sixth NMOS transistor MN17.

The output signal OUT and the complementary output signal OUTB of the full differential amplifier 42 are the input signals of the latch 44. The latch 44 includes a seventh NMOS transistor MN18, an eighth NMOS transistor MN19, a ninth NMOS transistor MN20, a fifth PMOS transistor MP13, and a sixth PMOS transistor MP14.

In the full differential amplifier 42, the first PMOS transistor MP9 has a source at a supply voltage VDD and a drain and a gate connected together. The second PMOS transistor MP10 has a source at the supply voltage VDD, a gate connected to the gate of the first PMOS transistor MP9, and a drain connected to the first output port 46. The first NMOS transistor MN12 has a gate connected to a node 52 functioning as a first input port and a drain connected to the drain of the first PMOS transistor MP9. The second NMOS transistor MN13 has a gate connected to a node 54 functioning as a first complementary input port and a drain connected to the first output port 46.

In the second differential amplifying unit, the third PMOS transistor MP11 has a source at the supply voltage VDD and a drain connected to the first complementary output port 48. The fourth PMOS transistor MP12 has a source at the supply voltage VDD and a drain and a gate connected to the gate of the third PMOS transistor MP11. The third NMOS transistor MN14 has a gate connected to node 52 and a drain connected to the first complementary output port 48. The fourth NMOS transistor MN15 has a gate connected to node 54 and a drain connected to the drain of the fourth PMOS transistor MP12. The fifth NMOS transistor MN16 is an operation controller connected to the first differential amplifying unit, the second differential amplifying unit, and the output voltage level control circuit 60. The drain of the fifth NMOS transistor MN16 is connected to the sources of the first NMOS transistor MN12, the second NMOS transistor MN13, the third NMOS transistor MN14, the fourth NMOS transistor MN15, and the sixth NMOS transistor MN17, and a ground voltage VSS is applied to the source of the fifth NMOS transistor MN16. The enable signal EN is applied to the gate of the fifth NMOS transistor to control the operation of the first differential amplifying unit, the second differential amplifying unit, and the output voltage level control circuit 60.

The output voltage level control circuit 60 includes an output voltage mean value sensing unit and an output voltage mean value controller. The output voltage mean value sensing unit includes the first and second resistors R1 and R2 serially connected between the first output port 46 and the first complementary output port 48. The resistors R1 and R2 have the same resistance, so that a node 50 between the resistors is at a voltage halfway between the voltages of the output signals OUT and OUTB. The output voltage mean value controller includes the sixth NMOS transistor MN17. The drain and gate of the sixth NMOS transistor MN17 are connected to the node 50 between the first resistor R1 and the second resistor R2.

The operation of the full differential amplifier 42 in the sense amplifier according to the above-described embodiment of the present invention is described below.

The first differential amplifying unit including the first PMOS transistor MP9, the second PMOS transistor MP10, the first NMOS transistor MP12, and the second NMOS transistor MN13 increases the voltage of the first output port 46 when the voltage level of the input signal SAOUT becomes higher than the voltage level of the complementary input signal SAOUTB. Conversely, the first differential amplifying unit reduces the voltage of the first output port 46 when the voltage level of the input signal SAOUT becomes lower than the voltage level of the complementary input signal SAOUTB. The second differential amplifying unit including the third PMOS transistor MPT11, the fourth PMOS transistor MP12, the third NMOS transistor MN14, and the fourth NMOS transistor MN15, reduces the voltage of the first complementary output port 48 when the voltage level of the input signal SAOUT becomes higher than the voltage level of the complementary input signal SAOUTB.

Conversely, the second differential amplifying unit increases the voltage of the first complementary output port 48 when the voltage level of the input signal SAOUT becomes lower than the voltage level of the complementary input signal SAOUTB.

The voltage at the node 50 between the first resistor R1 and the second resistor R2 is equal to the mean value of the voltage levels of the output signal OUT and the complementary output signal OUTB. The sixth NMOS transistor MN17 is wired to form a diode and turns on when the mean value voltage on the node 50 becomes larger than the diode turn-on voltage of the sixth NMOS transistor MN17. The fifth NMOS transistor MN16 turns on when the enable signal EN is at a high level, and thus the fifth NMOS transistor MN16 completes a path for current that flows through the sixth NMOS transistor MN17 and the fifth NMOS transistor MN16 to ground. Accordingly, when the mean value of the voltage levels of the output signal OUT and the complementary output signal OUTB exceeds the diode turn-on voltage of the sixth NMOS transistor MN17, the NMOS sixth transistor turns on and reduces the mean value voltage of the output signals OUT and OUTB. Accordingly, when the enable signal EN is at the high level, the output voltage level control circuit 60 prevents the mean value of the voltage levels of the output signal OUT and the complementary output signal OUTB from increasing beyond the turn-on voltage of the sixth NMOS transistor MN17.

When the supply voltage VDD increases during testing of the semiconductor integrated circuit in a high voltage test enable (HITE) mode (where a high voltage is used as the supply voltage), the channel length modulation effect of the PMOS transistors becomes larger than the channel length modulation effect of the NMOS transistors. Accordingly, the currents through the first through fourth PMOS transistors MP9, MP10, MP11, and MP12 increase. Therefore, the voltage levels of the output signal OUT and the complementary output signal OUTB simultaneously increase, and the operating voltage of the first through fourth PMOS transistors MP9, MP10, MP11, and MP12 becomes higher. Accordingly, the mean value of the output voltage levels of the output signal OUT and the complementary output signal OUTB increases. At this time, the output voltage mean value sensing unit, which includes the first resistor R1 and the second resistor R2, senses the mean value of the voltage levels of the output signal OUT and the complementary output signal OUTB and outputs the sensed mean value to the node 50.

When the increased mean value is output to the node 50, the voltages of the gate and the drain of the sixth NMOS transistor MN17 increase, thus turning on the sixth NMOS transistor MN17. Accordingly, some of the current provided by the first through fourth PMOS transistors MP9, MP10, MP11, and MP12 flows through the sixth NMOS transistor MN17 and the fifth NMOS transistor MN16 to the ground. Therefore, the mean value of the output voltages of the output signal OUT and the complementary output signal OUTB is reduced, to thus stabilize the operation of the latch 44.

Since the first resistor R1 and the second resistor R2 are between the first output port 46 and the first complementary output port 48, it is possible to control the voltage gain of the full differential amplifier by controlling the resistances of the first resistor R1 and the second resistor R2. The voltage gain of the full differential amplifier is proportionate to the transconductances of the NMOS transistors MN13 and MN14 connected to the first output port 46 and the first complementary output port 48, respectively, and the resistance of the first resistor R1 or the second resistor R2.

Figure 5:
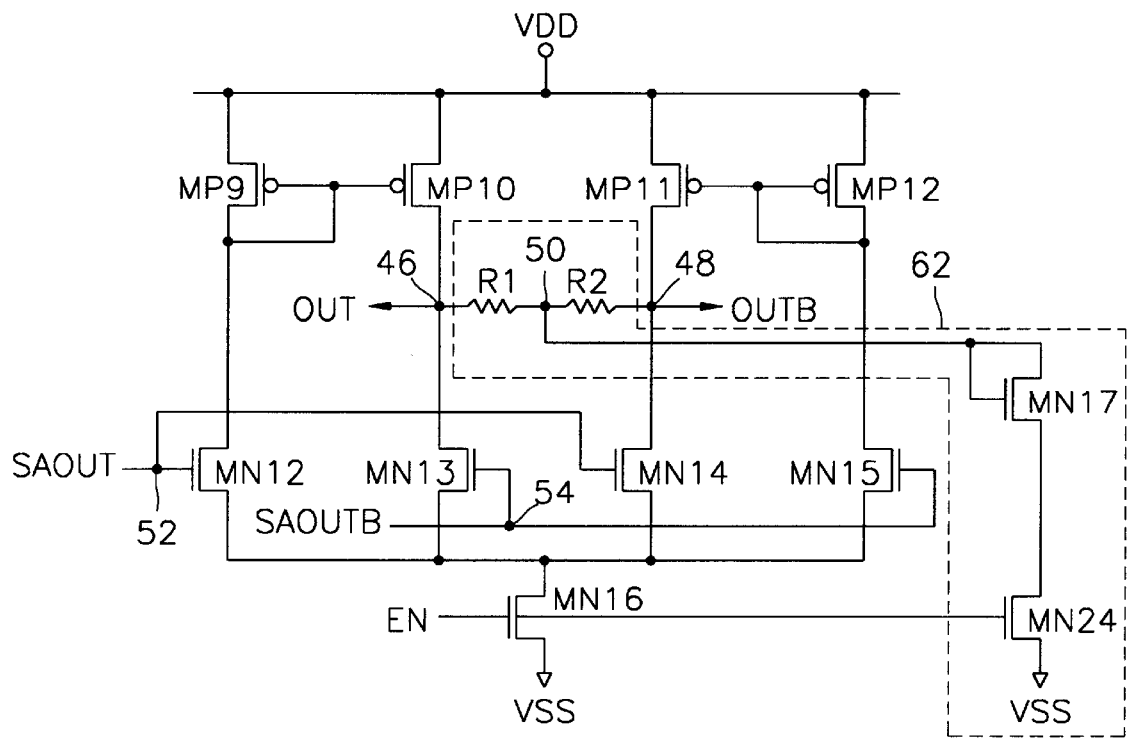
FIGS. 5 and 6 show other full differential amplifiers in accordance with embodiments of the invention.
Figure 6:
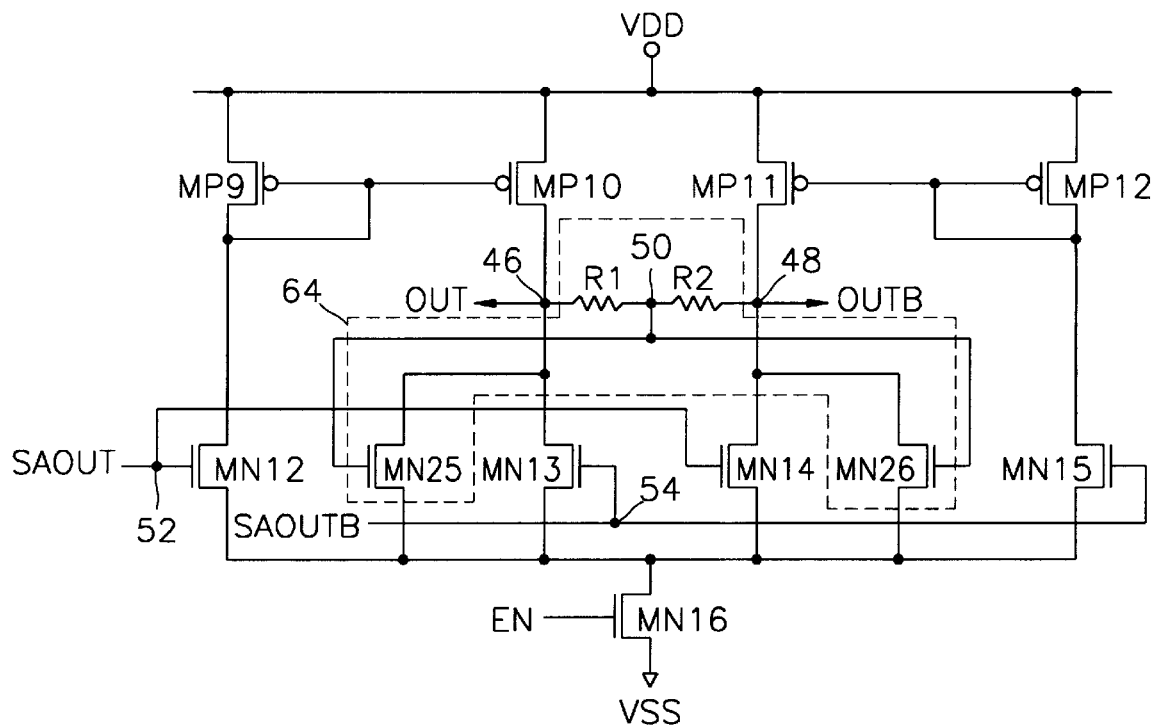

FIGS. 5 and 6 show other embodiments of the full differential amplifier. In the full differential amplifier shown in FIG. 5, an output voltage level control circuit 62 includes the output voltage mean value sensing unit and the output voltage mean value controller. The output voltage mean value sensing unit includes the first resistor R1 and the second resistor R2. The first resistor R1 and the second resistor R2 are serially connected to each other between the first output port 46 and the first complementary output port 48 and have the same resistance. The output voltage mean value controller includes the sixth NMOS transistor MN17 and a tenth NMOS transistor MN24. The sixth NMOS transistor MN17 has a gate and a drain connected to the node 50 between the first resistor R1 and the second resistor R2. The tenth NMOS transistor 24 has a drain connected to the source of the sixth NMOS transistor MN17, a gate that receives the enable signal EN, and a source that is grounded (i.e., at the ground voltage VSS).

In the full differential amplifier shown in FIG. 6, an output voltage level control circuit 64 includes an eleventh NMOS transistor MN25 and a twelfth NMOS transistor MN26. The eleventh NMOS transistor MN25 has a gate connected to the node 50 between the first resistor R1 and the second resistor R2, a drain connected to the first output port 46, and a source connected to the drain of the fifth NMOS transistor MN16. The twelfth NMOS transistor MN26 has a gate connected to the node 50 between the first resistor R1 and the second resistor R2, a drain connected to the first complementary output port 48, and a source connected to the drain of the fifth NMOS transistor MN16.

In the full differential amplifier of FIG. 6, the output voltage level control circuit 64 is such that a bypass current path does not pass through the first resistor R1 and the second resistor R2. This more stably controls the mean value of the output voltage levels of the output signal OUT and the complementary output signal OUTB.

Figure 7:
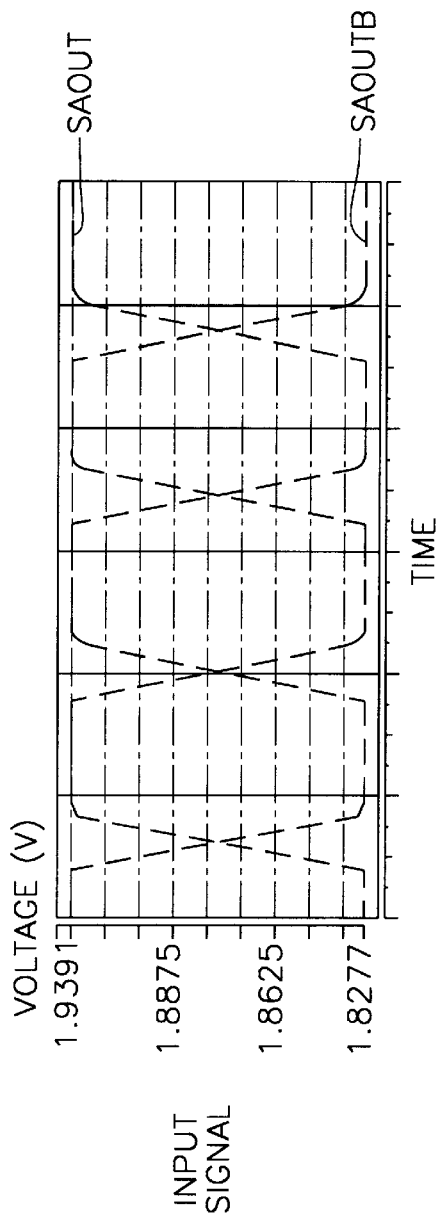
FIG. 7 shows waveforms of input signals for a simulation of a full differential amplifier.
Figure 8:
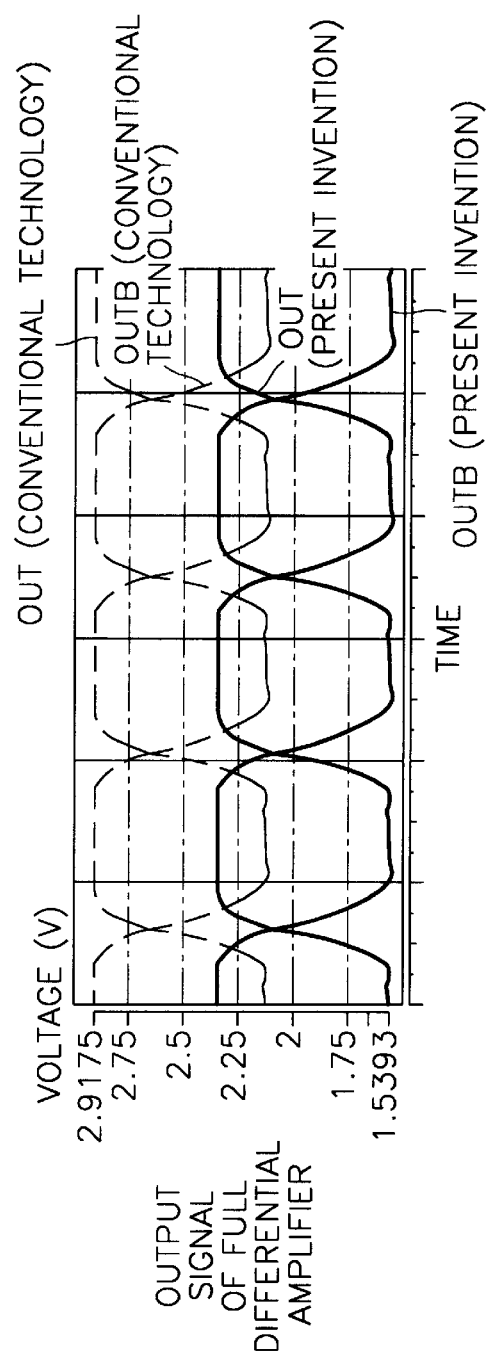
FIG. 8 shows waveforms for the output signals of a full differential amplifier according to an embodiment of the present invention and a conventional full differential amplifier according to a simulation experiment.
Figure 9:
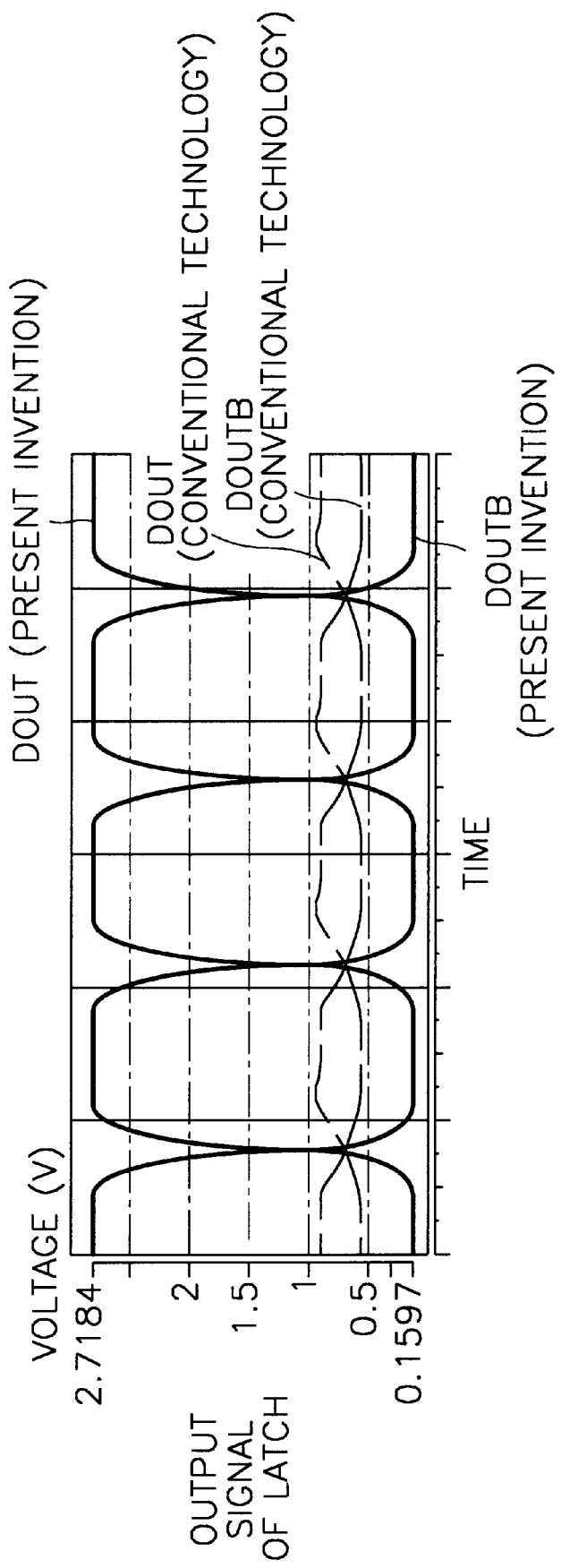
FIG. 9 shows waveforms for the output signals of a latch where the output of a full differential amplifier according to the present invention is an input and where the output of the conventional full differential amplifier is an input, respectively, according to the simulation experiment.

FIGS. 7 through 9 show waveforms resulting from a simulation experiment for verifying the performances of the full differential amplifiers in the sense amplifiers according to embodiments of the present invention. FIG. 7 shows a waveform of the input signals SAOUT and SAOUTB used for the simulation experiment. FIG. 8 shows output signals of a full differential amplifier according to the present invention and of a conventional full differential amplifier. FIG. 9 shows output signals of a latch when the output of the full differential amplifier according to the present invention is used as an input and when the output of the conventional full differential amplifier is used as an input.

For simulation, the supply voltage VDD is 4 volts, and the difference between the input signal IN and the complementary input signal INB is about 0.1 volts. Referring to FIGS. 7 through 9, the conventional full differential amplifier may mis-operate since the mean value of the voltage levels of the output signal and the complementary output signal is higher and the output signals DOUT and DOUTB of the latch go to a low level as a result. However, the full differential amplifier in the sense amplifier according to the present invention outputs normal output signals OUT and OUTB since the mean value of the voltage levels of the output signal and the complementary output signal are reduced, and the latch operates normally.

Figure 10:
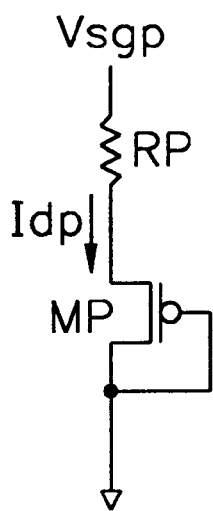
FIG. 10 shows a PMOS diode for describing the operation of a current sense amplifier in the sense amplifier according to an embodiment of the present invention.

FIG. 10 shows a PMOS diode for describing the operation of the current sense amplifier 40 in the sense amplifier according to the embodiment of the present invention shown in FIG. 4. In the circuit shown in FIG. 10, a resistor RP is serially connected to and close to the source of a PMOS diode MP. The current-voltage characteristic curves of the elements and the circuit shown in FIG. 10 are shown in FIG. 11.

Figure 11:
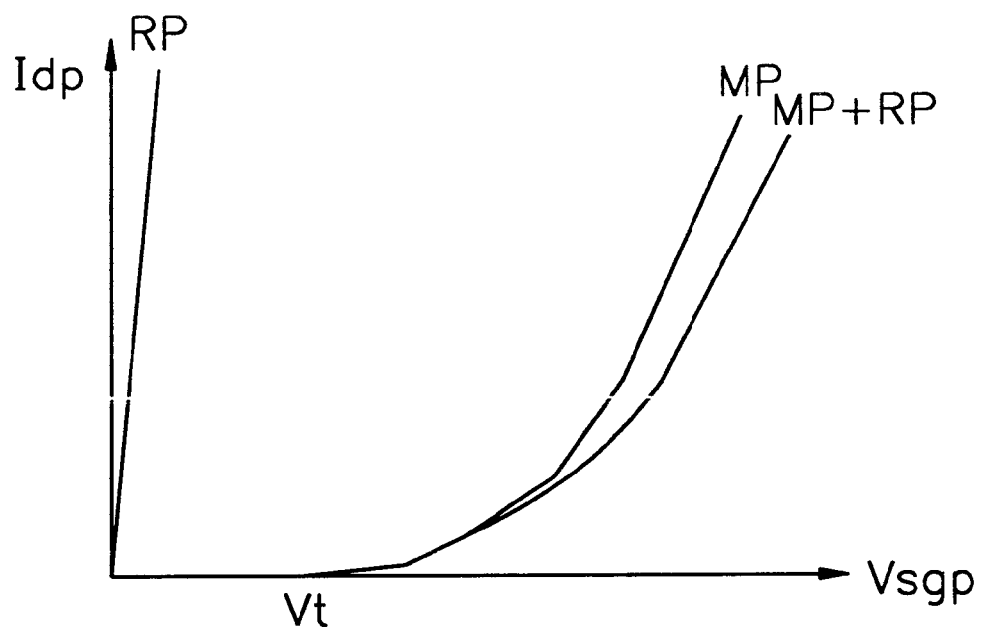
FIG. 11 shows the current-voltage characteristic curves of the PMOS diode shown in FIG. 10.

As shown in FIG. 11, a voltage Vsgp is the sum of the voltage difference between the source and drain of the PMOS transistor MP and the voltage drop across the resistance RP. Accordingly, the resistance RP has a slight effect on the voltage Vsgp when the current through the PMOS diode MP is low. However, the effective transconductance of the circuit of FIG. 10 is reduced when the current is large. When the resistance RP is referred to as R and the transconductance value of the PMOS diode MP is referred to as gmp, the effective transconductance of the circuit of FIG. 10 is gmp/(1+gmp×R). Namely, when transconductance gmp is small, the influence of the resistance R is small. However, when transconductance gmp is large, the influence of the resistance R makes the effective transconductance smaller than transconductance gmp.

In FIG. 4, the current sense amplifier 40 includes a cross-coupled PMOS transistor structure 59 including a third resistor R3, a fourth resistor R4, a seventh PMOS transistor MP15, and an eighth PMOS transistor MP16. A thirteenth NMOS transistor MN21; a fourteenth NMOS transistor MN22; and a fifteenth NMOS transistor MN23 provide current paths between the cross-coupled PMOS transistor structure 59 and ground.

The cross-coupled PMOS transistor structure 59 amplifies the current signals I1 and I2 input to a second input port 55 and a second complementary input port 57, and outputs output voltage signals SAOUT and SAOUTB to node 52 functioning as a second output port and to node 54 functioning as a second complementary output port. The thirteenth NMOS transistor MN21 and the fourteenth NMOS transistor MN22 are serially connected to node 52 and node 54, respectively. The gate and the drain of the thirteenth NMOS transistor MN21 are connected together, and the gate and the drain of the fourteenth NMOS transistor MN22 are connected together. The fifteenth NMOS transistor MN23 is connected to the sources of the thirteenth NMOS transistor MN21 and the fourteenth NMOS transistor MN22 and to ground voltage VSS. The enable signal EN determines the conductivity state of the fifteenth NMOS transistor and thereby enables or enables operation of the current sense amplifier 40. The third resistor R3 is serially connected between the second input port IN and the source of the seventh PMOS transistor MP15. The fourth resistor R4 is serially connected between of the second complementary input port INB and the source of the eighth PMOS transistor MP16.

The current sense amplifier 40 in the sense amplifier according to the embodiment of the present invention shown in FIG. 4 operates stably since the third and fourth resistors R3 and R4 make the effective transconductances of the PMOS transistors MP15 and MP16 smaller than the transconductances of the NMOS transistors MN21 and MN22.

It is preferable to minimize parasitic resistances in the wiring between the third resistor R3 and the source of the seventh PMOS transistor MP15 and in the wiring between the fourth resistor R4 and the source of the eighth PMOS transistor MP16. Locating the third resistor R3 and the fourth resistor R4 as close as possible to the sources of the seventh PMOS transistor MP15 and the eighth PMOS transistor MP16, respectively, minimizes the RC delay time of the current sense amplifier, arising from the third and fourth resistors R3 and R4. When the third and fourth resistors R3 and R4 are as close as possible to the sources of the seventh and eighth PMOS transistors MP15 and MP16, respectively, and the third and fourth resistors R3 and R4 have resistance R, the RC delay time according to the resistance component is R×(the contact capacitance of the source of the seventh PMOS transistor or the eighth PMOS transistor), which is negligible. Preferably, the resistance R of the third resistor R3 and the fourth resistor R4 is less than about 100Ω.

Figure 12:
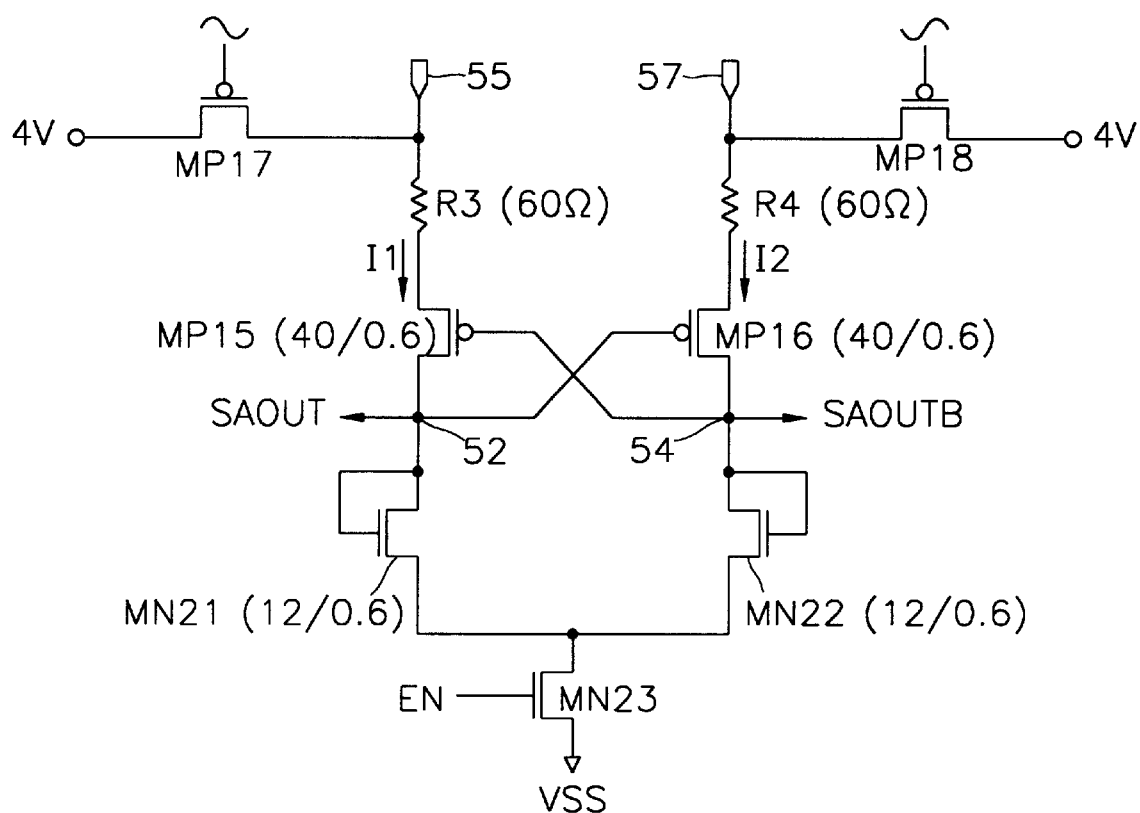
FIG. 12 is a circuit diagram of a current sense amplifier in the sense amplifier according to the embodiment of the present invention.

FIG. 12 is a circuit diagram used for a simulation experiment for verifying the performance of the current sense amplifier 40 in the sense amplifier according to the embodiment of the present invention of FIG. 4 In FIG. 12, PMOS current sources MP17 and MP18 are connected to the third resistor R3 and the fourth resistor R4, respectively. The resistance R of the third resistor R3 and the fourth resistor R4 is 60Ω. The channel width/channel length of the seventh PMOS transistor MP15 and the eighth PMOS transistor MP16 is 40/0.6. The channel width/channel length of the thirteenth NMOS transistor MN21 and the fourteenth NMOS transistor MN22 is 12/0.6. The supply voltage supplied to the PMOS current sources MP17 and MP18 is 4 volts and the magnitude of the input currents I1 and I2 is about 1.28 mA±0.3 mA.

Figure 1:
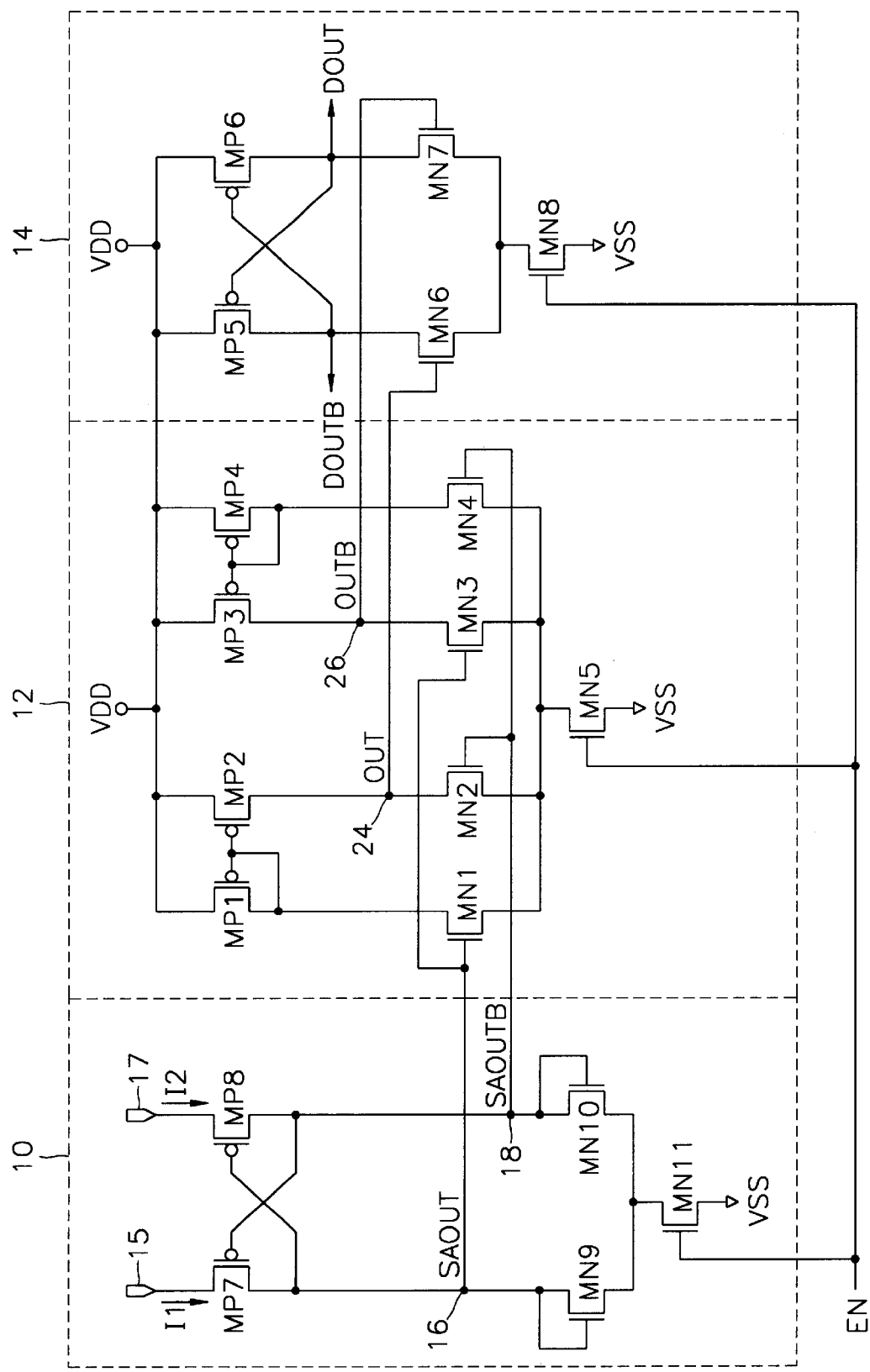
FIG. 1 shows a conventional sense amplifier.
Figure 2:
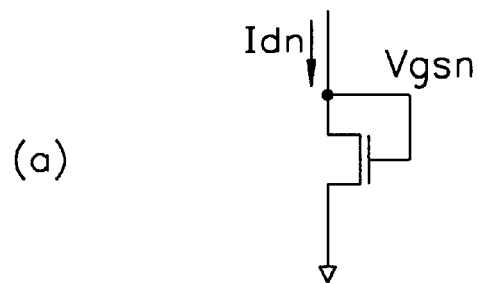
FIG. 2 shows an NMOS diode and a PMOS diode.
Figure 2:
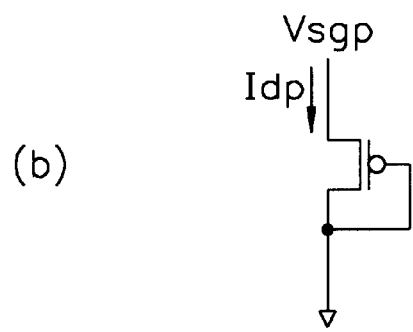
Figure 3:
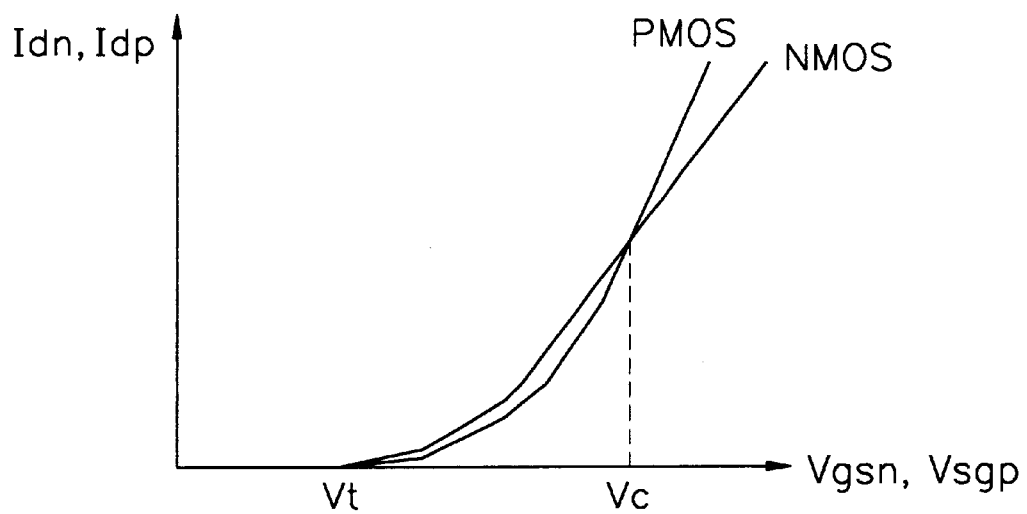
FIG. 3 shows the current-voltage characteristic curves of the NMOS diode and the PMOS diode shown in FIG. 2.
Figure 13:
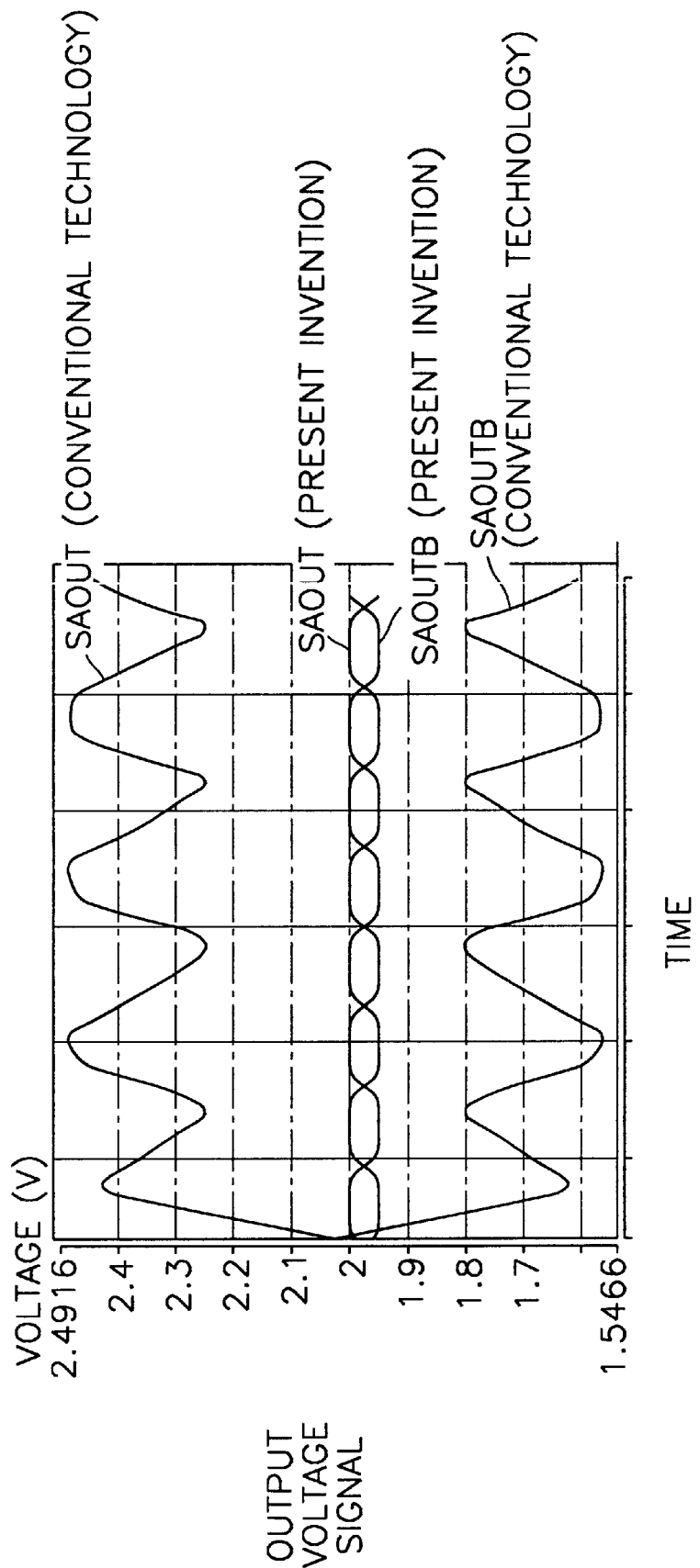
FIG. 13 shows waveforms of the output voltage signals of the current sense amplifier according to an embodiment of the present invention and a conventional current sense amplifier, according to the simulation experiment.
Figure 14:
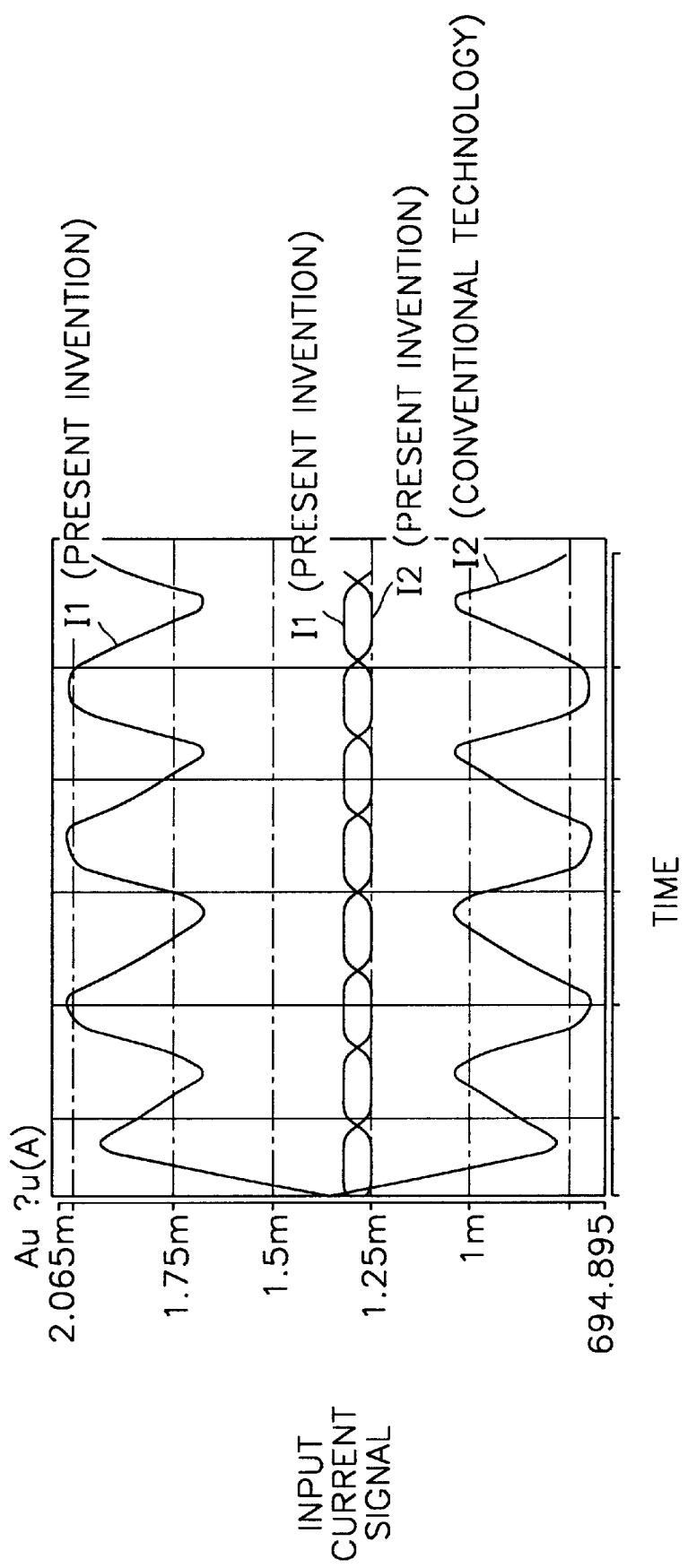
FIG. 14 shows waveforms of the input current signals of the current sense amplifier according to the embodiment of the present invention and the conventional current sense amplifier, according to the simulation experiment.

FIG. 13 shows waveforms of the output voltage signals of the current sense amplifier 10 (FIG. 1) in the conventional sense amplifier and the output voltage signals of the current sense amplifier 40 in the sense amplifier according to the embodiment of the present invention shown in FIG. 4. FIG. 14 shows waveforms of the input current signals of the current sense amplifier 10 in the conventional sense amplifier and the input current signals of the current sense amplifier 40 in the sense amplifier according to the embodiment of the present invention shown in FIG. 4.

The current sense amplifier in the conventional sense amplifier operates unstably since the transconductance of the PMOS transistors becomes larger than the transconductance of the NMOS transistors, to thus affect the input current signal and the output voltage signal, as shown in FIGS. 13 and 14. However, the current sense amplifier in the sense amplifier according to the present invention stably operates since the resistance components prevent the oscillation phenomenon.

FIGS. 15, 16A, 16B, and 17 illustrate methods for directly forming the third resistor R3 or the fourth resistor R4 of the current sense amplifier 40 in FIG. 4, in the transistors MP15 or MP16.

Figure 15:
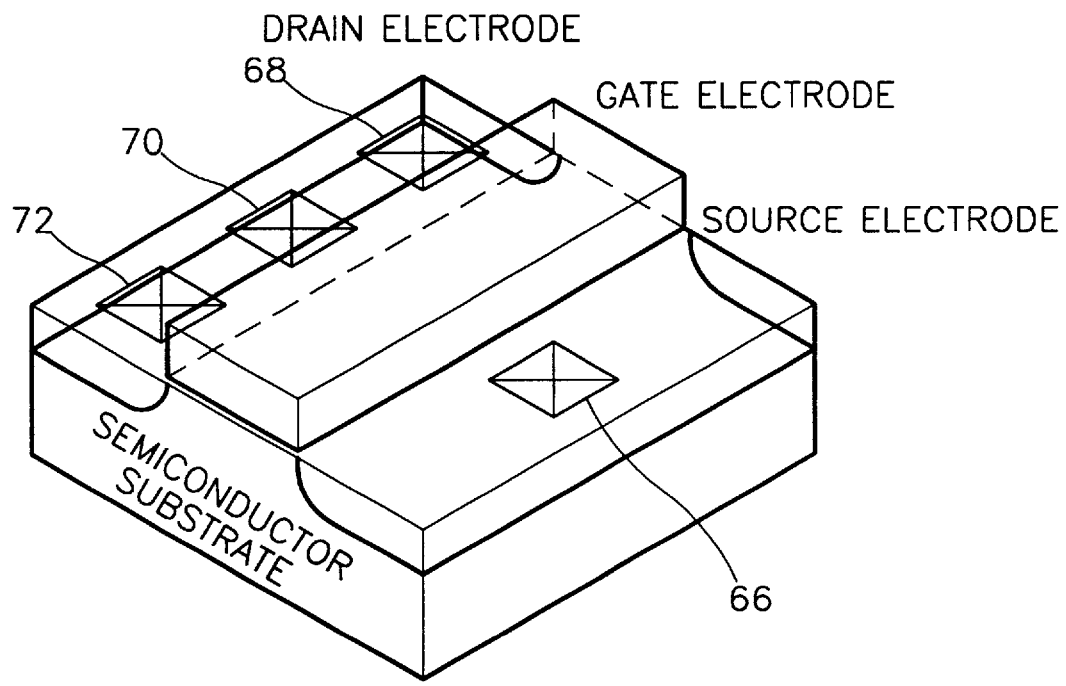
FIGS. 15, 16A, 16B, and 17 illustrate methods of directly forming the resistors of the current sense amplifier in FIG. 4 in transistors.

In FIG. 15, the contact resistance of the source electrodes of a PMOS transistor provides the desired resistance R. The resistances of the third resistor R3 or the fourth resistor R4 can thus be realized as the contact resistance of the source electrodes of the transistors MP15 and MP16. In FIG. 15, one contact 66 connects to the source electrode of the transistor, and multiple contacts 68, 70, and 72 connect to the drain electrode. For example, if each contact 66, 68, 70, and 72 has a resistance of 100Ω, the source electrode has a contact resistance of 100Ω, and the drain electrode has a contact resistance of 100/3Ω in the transistor.

Figure 16:
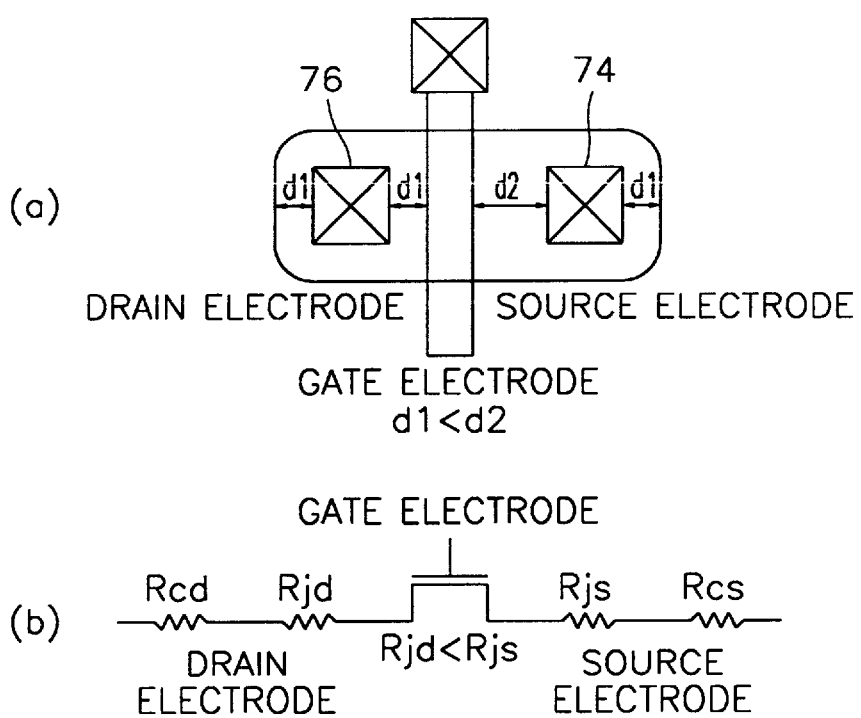

FIG. 16A illustrates an embodiment where the resistances of the third resistor R3 or the fourth resistor R4 are realized as the resistance of the active region of the source electrode. More particularly, the separation of a contact 74 of the source electrode of the transistor from one edge of the gate electrode is greater than the separation of a contact 76 of the drain electrode from the opposite edge of the gate electrode. FIG. 16B is an equivalent circuit of FIG. 16A. In FIG. 16B, Rcd, Rcs, Rjd, and Rjs respectively denote a drain contact resistance, a source contact resistance, a drain junction resistance, and a source junction resistance.

Figure 17:
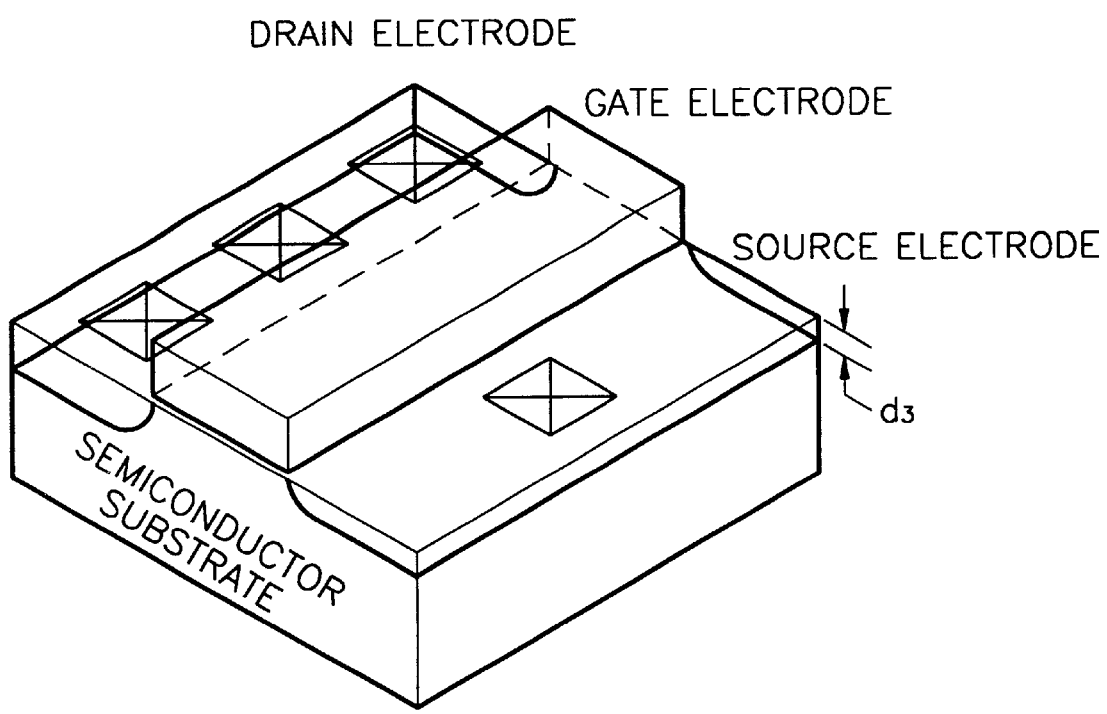

FIG. 17 illustrates an embodiment in which a depth d3 of the active region of the source electrode is thin, to increase the active resistance on the source side of a transistor. The active resistance increases as the depth, that is, the thickness of the active region, is reduced. FIG. 17 also illustrates that the thin active region can be used in combination with the contact resistance as described above in regard to FIG. 15.

Also, it is possible to realize the resistance of the third resistor R3 or the fourth resistor R4 by reducing the impurity density of the active region of the source electrode of the transistor, thus increasing the active resistance of the source.

While this invention has been particularly shown and described with reference to exemplary embodiments thereof, various changes in form and details may be made therein without departing from the spirit and scope of the invention as defined by the appended claims. Also, the sense amplifier and the full differential amplifier included in the sense amplifier of the semiconductor integrated circuit according to the present invention can be used in other application fields as independent circuits as well as in the sense amplifier as shown in the embodiments of the present invention.

The sense amplifier of the semiconductor integrated circuit according to the present invention can stabilize the operation of the latch by reducing the mean voltage level of the output signal even when the supply voltage increases, easily control the voltage gain of the full differential amplifier by controlling the resistance, and stably operate at high speed by preventing an oscillation phenomenon which can occur when the gain of the PMOS transistor increases.

What is claimed is:

1. A semiconductor integrated circuit comprising:
    a sense amplifier, wherein the sense amplifier amplifies an input signal received at a first input port and a complementary input signal received at a first complementary input port;
    a full differential amplifier, wherein the full differential amplifier amplifies output of the sense amplifier, the full differential amplifier comprising:
        a second input port, a second complementary input port, an output port, and a complementary output port;
        a first differential amplifying unit, wherein the first differential amplifying unit increases a voltage at the output port when a voltage at the second input port is larger than a voltage at the second complementary input port, and reduces the voltage at the output port when the voltage at the second input port is lower than the voltage at the second complementary input port;
        a second differential amplifying unit, wherein the second differential amplifying unit reduces a voltage at the complementary output port when the voltage at the second input port is larger than the voltage at the second complementary input port, and increases the voltage at the complementary output port when the voltage at the second input port is lower than the voltage at the second complementary input port; and
        an output voltage level control circuit connected between the output port and the complementary output port, wherein the output voltage level control circuit controls the voltages at the output port and the complementary output port, the output voltage level control circuit comprising:
            an output voltage mean value sensing unit, wherein the mean value sensing unit senses a mean value of the voltages at the output port and at the complementary output port, the mean value sensing unit comprising a first resistor and a second resistor serially connected between the output port and the complementary output port, wherein the first and second resistors are approximately equal resistance, and wherein the voltage mean value is output from a node between the first and second resistors; and
            an output mean value controller, wherein the mean value controller prevents the voltage mean value from increasing to more than a predetermined value, the mean value controller comprising an transistor comprising a source, a drain, and a gate, wherein the gate is electrically coupled to the drain, the drain is electrically coupled to the node between the first and second resistors, and the source is electrically coupled to a ground; and
    a latch, wherein the latch latches output of the full differential amplifier and outputs a latched output signal.

2. The circuit of claim 1, wherein the full differential amplifier further comprises an operation controller connected to the first differential amplifying unit, the second differential amplifying unit, and the output voltage level control circuit, wherein the operation controller controls the operation of the first differential amplifying unit, the second differential amplifying unit, and the output voltage level control circuit according to an enable signal.

3. The circuit of claim 2, wherein the first differential amplifying unit comprises:
    a first PMOS transistor, wherein a supply voltage is applied to a source of the first PMOS transistor, and a drain and a gate of the first PMOS transistor are connected;
    a second PMOS transistor, wherein the supply voltage is applied to a source of the second PMOS transistor, a gate of the second PMOS transistor is connected to the gate of the first PMOS transistor, and a drain of the second PMOS transistor is connected to the output port;
    a second NMOS transistor, wherein a gate of the second NMOS transistor is connected to the second input port and a drain of the second NMOS transistor is connected to the drain of the first PMOS transistor, and
    a third NMOS transistor, wherein a gate of the third NMOS transistor is connected to the second complementary input port and a drain of the third NMOS transistor is connected to the output port;
wherein the second differential amplifying unit comprises:
    a third PMOS transistor, wherein the supply voltage is applied to a source of the third PMOS transistor and a drain of the third PMOS transistor is connected to the complementary output port;
    a fourth PMOS transistor, wherein the supply voltage is applied to a source of the fourth PMOS transistor, a drain and a gate of the fourth PMOS transistor are connected, and the gate of the fourth PMOS transistor is connected to the gate of the third PMOS transistor;
    a fourth NMOS transistor, wherein a gate of the fourth NMOS transistor is connected to the second input port and a drain of the fourth NMOS transistor is connected to the complementary output port; and
    a fifth NMOS transistor, wherein a drain of the fifth NMOS transistor is connected to the drain of the fourth PMOS transistor and a gate of the fifth NMOS transistor is connected to the second complementary input port; and wherein the operation controller comprises a sixth NMOS transistor, wherein a drain of the sixth NMOS transistor is connected to the sources of the second NMOS transistor, the third NMOS transistor, the fourth NMOS transistor, the fifth NMOS transistor, and the output voltage mean value controller.

4. The circuit of claim 1, wherein the sense amplifier comprises:
- a first transistor and a second transistor cross coupled to each other, wherein the first and second transistors receive current signals output from the first input port and the first complementary input port, respectively, and output a first output signal and a second output signal, respectively, to the second input port and the second complementary input port, respectively;
- a third transistor and a fourth transistor, wherein the third and fourth transistors supply current to the second input port and the second complementary input port, respectively;
- a third resistor coupled between the first input port and the first transistor; and
- a fourth resistor coupled between the first complementary input port and the second transistor.

5. The circuit of claim 4, wherein the third resistor and the fourth resistor are immediately adjacent the first transistor and the second transistor, respectively.

6. The circuit of claim 4, wherein the sense amplifier further comprises a fifth transistor, wherein the fifth transistor forms a current path so that the third transistor and the fourth transistor operate in response to an enable signal.

7. The circuit of claim 4, wherein the third transistor and the fourth transistor of the sense amplifier are connected to form diodes.

8. The circuit of claim 4, wherein the first transistor and the second transistor are PMOS transistors, and the third transistor and the fourth transistor are NMOS transistors.

9. The circuit of claim 4, wherein:
the third resistor is directly formed in the first transistor by forming one contact to the source of the first transistor and forming more contacts to the drain of the first transistor than formed to the source, so that contact resistance of the source of the first transistor provides the resistance of the third resistor; and
the fourth resistor is directly formed in the second transistor by forming one contact to the source of the second transistor and forming more contacts to the drain of the second transistor than formed to the source, so that contact resistance of the source of the second transistor provides the resistance of the fourth resistor.

10. The circuit of claim 4, wherein:
the third resistor is directly formed in the first transistor by forming a contact to the source of the first transistor farther from the gate of the first transistor than is a contact to the drain of the first transistor so that resistance of the source provides the resistance of the third resistor; and
the fourth resistor is directly formed in the second transistor by forming a contact of the source of the second transistor farther from the gate of the second transistor than is a contact to the drain of the second transistor so that the resistance of the source provides the resistance of the fourth resistor.

11. The circuit of claim 4, wherein:
the third resistor is directly formed in the first transistor by forming a depth of an active region of the source of the first transistor to be thin so that resistance of the first active region provides the resistance of the third resistor; and
the fourth resistor is directly formed in the second transistor by forming a depth of an active region of the source of the second transistor to be thin so that resistance of the second active region provides the resistance of the fourth resistor.

12. The circuit of claim 4, wherein:
the third resistor is directly formed in the first transistor by providing a low density of impurities in the source of the first transistor so that active resistance of the source of the first transistor provides the resistance of the third resistor; and
the fourth resistor is directly formed in the second transistor by providing a low density of impurities in the source of the second transistor so that the active resistance of the source of the second transistor provides the resistance of the fourth resistor.

13. A semiconductor integrated circuit comprising:
a sense amplifier, wherein the sense amplifier amplifies an input signal received at a first input port and a complementary input signal received at a first complementary input port;
a full differential amplifier, wherein the fall differential amplifier amplifies output of the sense amplifier, the full differential amplifier comprising:
- an input port, a complementary input port, an output port, and a complementary output port;
- a first differential amplifying unit, wherein the first differential amplifying unit increases a voltage at the output port when a voltage at the input port is larger than a voltage at the complementary input port, and reduces the voltage at the output port when the voltage at the input port is lower than the voltage at the complementary input port;
- a second differential amplifying unit, wherein the second differential amplifying unit reduces a voltage at the complementary output port when the voltage at the input port is larger than the voltage at the complementary input port, and increases the voltage at the complementary output port when the voltage at the input port is lower than the voltage at the complementary input port; and
- an output voltage level control circuit connected between the output port and the complementary output port, wherein the output voltage level control circuit controls the voltages at the output port and the complementary output port, the output voltage level control circuit comprising:
  - an output voltage mean value sensing unit, wherein the mean value sensing unit senses a mean value of the voltages at the output port and at the complementary output port, the mean value sensing unit comprising a first resistor and a second resistor serially connected between the output port and the complementary output port, wherein the voltage mean value is output from a node between the first and second resistors; and
  - an output mean value controller, wherein the mean value controller prevents the voltage mean value from increasing to more than a predetermined value, the mean value controller comprising a first NMOS transistor comprising a first source, a first gate, and a first drain, and a second NMOS transistor comprising a second source, a second gate, and a second drain, wherein the first and second gates are coupled to the node between the first and second resistors, the first drain is coupled to the output port, the second drain is coupled to the complementary output port, and the first source and the second source are coupled to a ground; and a latch, wherein the latch latches output of the full differential amplifier and outputs a latched output signal.

14. The circuit of claim 13, wherein the full differential amplifier further comprises an operation controller connected to the first differential amplifying unit, the second differential amplifying unit, and the output voltage level control circuit, wherein the operation controller controls the operation of the first differential amplifying unit, the second differential amplifying unit, and the output voltage level control circuit according to an enable signal.

15. The circuit of claim 14, wherein the first differential amplifying unit comprises:

a first PMOS transistor, wherein a supply voltage is applied to a source of the first PMOS transistor, and a drain and a gate of the first PMOS transistor are connected;

a second PMOS transistor, wherein the supply voltage is applied to a source of the second PMOS transistor, a gate of the second PMOS transistor is connected to the gate of the first PMOS transistor, and a drain of the second PMOS transistor is connected to the output port;

a second NMOS transistor, wherein a gate of the second NMOS transistor is connected to the second input port and a drain of the second NMOS transistor is connected to the drain of the first PMOS transistor; and a third NMOS transistor, wherein a gate of the third NMOS transistor is connected to the second complementary input port and a drain of the third NMOS transistor is connected to the output port;

wherein the second differential amplifying unit comprises:

a third PMOS transistor, wherein the supply voltage is applied to a source of the third PMOS transistor and a drain of the third PMOS transistor is connected to the complementary output port;

a fourth PMOS transistor, wherein the supply voltage is applied to a source of the fourth PMOS transistor, a drain and a gate of the fourth PMOS transistor are connected, and the gate of the fourth PMOS transistor is connected to the gate of the third PMOS transistor;

a fourth NMOS transistor, wherein a gate of the fourth NMOS transistor is connected to the second input port and a drain of the fourth NMOS transistor is connected to the complementary output port; and a fifth NMOS transistor, wherein a drain of the fifth NMOS transistor is connected to the drain of the fourth PMOS transistor and a gate of the fifth NMOS transistor is connected to the second complementary input port; and wherein the operation controller comprises a sixth NMOS transistor, wherein a drain of the sixth NMOS transistor is connected to the sources of the second NMOS transistor, the third NMOS transistor, the fourth NMOS transistor, the fifth NMOS transistor, and the output voltage mean value controller.

16. The circuit of claim 13, wherein the sense amplifier comprises:

a first transistor and a second transistor cross coupled to each other, wherein the first and second transistors receive current signals output from the first input port and the first complementary input port, respectively, and output a first output signal and a second output signal, respectively, to the second input port and the second complementary input port, respectively, a third transistor and a fourth transistor, wherein the third and fourth transistors supply current to the second input port and the second complementary input port, respectively;

a third resistor coupled between the first input port and the first transistor; and a fourth resistor coupled between the first complementary input port and the second transistor.

17. The circuit of claim 16, wherein the third resistor and the fourth resistor are immediately adjacent the first transistor and the second transistor, respectively.

18. The circuit of claim 16, wherein the sense amplifier further comprises a fifth transistor, wherein the fifth transistor forms a current path so that the third transistor and the fourth transistor operate in response to an enable signal.

19. The circuit of claim 16, wherein the third transistor and the fourth transistor of the sense amplifier are connected to form diodes.

20. The circuit of claim 16, wherein the first transistor and the second transistor are PMOS transistors, and the third transistor and the fourth transistor are NMOS transistors.

21. The circuit of claim 16, wherein:

the third resistor is directly formed in the first transistor by forming one contact to the source of the first transistor and forming more contacts to the drain of the first transistor than formed to the source, so that contact resistance of the source of the first transistor provides the resistance of the third resistor; and the fourth resistor is directly formed in the second transistor by forming one contact to the source of the second transistor and forming more contacts to the drain of the second transistor than formed to the source, so that contact resistance of the source of the second transistor provides the resistance of the fourth resistor.

22. The circuit of claim 16, wherein:

the third resistor is directly formed in the first transistor by forming a contact to the source of the first transistor farther from the gate of the first transistor than is a contact to the drain of the first transistor so that resistance of the source provides the resistance of the third resistor; and the fourth resistor is directly formed in the second transistor by forming a contact of the source of the second transistor farther from the gate of the second transistor than is a contact to the drain of the second transistor so that the resistance of the source provides the resistance of the fourth resistor.

23. The circuit of claim 16, wherein:

the third resistor is directly formed in the first transistor by forming a depth of an active region of the source of the first transistor to be thin so that resistance of the active region provides the resistance of the third resistor; and the fourth resistor is directly formed in the second transistor by forming a depth of an active region of the source of the second transistor to be thin so that resistance of the active region provides the resistance of the fourth resistor.

24. The circuit of claim 16, wherein:

the third resistor is directly formed in the first transistor by providing a low density of impurities in the source of the first transistor so that active resistance of the source of the first transistor provides the resistance of the third resistor; and the fourth resistor is directly formed in the second transistor by providing a low density of impurities in the source of the second transistor so that the active resistance provides the resistance of the fourth resistor.

25. The circuit of claim 1, wherein the first and second resistors are approximately equal resistance.

26. A full differential amplifier comprising:

an input port, a complementary input port, an output port, and a complementary output port;

a first differential amplifying unit, wherein the first differential amplifying unit increases a voltage at the output port when a voltage at the input port is larger than a voltage at the complementary input port, and reduces the voltage at the output port when the voltage at the input port is lower than the voltage at the complementary input port;

a second differential amplifying unit, wherein the second differential amplifying unit reduces a voltage at the complementary output port when the voltage at the input port is larger than the voltage at the complementary input port, and increases the voltage at the complementary output port when the voltage at the input port is lower than the voltage at the complementary input port; and an output voltage level control circuit connected between the output port and the complementary output port, wherein the output voltage level control circuit controls the voltages at the output port and the complementary output port, the output voltage level control circuit comprising:

an output voltage mean value sensing unit, wherein the mean value sensing unit senses a mean value of the voltages at the output port and at the complementary output port, the mean value sensing unit comprising a first resistor and a second resistor serially connected between the output port and the complementary output port, wherein the first and second resistors are approximately equal resistance, and wherein the voltage mean value is output from a node between the first and second resistors; and an output mean value controller, wherein the mean value controller prevents the voltage mean value from increasing to more than a predetermined value, the mean value controller comprising an NMOS transistor comprising a source, a drain, and a gate, wherein the gate is electrically coupled to the drain, the drain is electrically coupled to the node between the first and second resistors, and the source is electrically coupled to a ground.

27. The full differential amplifier of claim 26, further comprising an operation controller connected to the first differential amplifying unit, the second differential amplifying unit, and the output voltage level control circuit, the operation controller controlling the operation of the first differential amplifying unit, the second differential amplifying unit, and the output voltage level control circuit according to an enable signal.

28. The full differential amplifier of claim 27, wherein the first differential amplifying unit comprises:

a first PMOS transistor, wherein a supply voltage is applied to a source of the first PMOS transistor, and a drain and a gate of the first PMOS transistor are connected;

a second PMOS transistor, wherein the supply voltage is applied to a source of the second PMOS transistor, a gate of the second PMOS transistor is connected to the gate of the first PMOS transistor, and a drain of the second PMOS transistor is connected to the output port;

a second NMOS transistor, wherein a gate of the first NMOS transistor is connected to the input port and a drain of the first NMOS transistor is connected to the drain of the first PMOS transistor; and a third NMOS transistor, wherein a gate of the second NMOS transistor is connected to the complementary input port and a drain of the second NMOS transistor is connected to the output port;

wherein the second differential amplifying unit comprises:

a third PMOS transistor, wherein the supply voltage is applied to the source of the third PMOS transistor, and the drain of the third PMOS transistor is connected to the complementary output port;

a fourth PMOS transistor, wherein the supply voltage is applied to a source of the fourth PMOS transistor, a drain and a gate of the fourth PMOS transistor are connected, and the gate of the fourth PMOS transistor is connected to the gate of the third PMOS transistor;

a fourth NMOS transistor wherein a gate of the fourth NMOS transistor is connected to the input port and a drain of the fourth NMOS transistor is connected to the complementary output port; and a fifth NMOS transistor wherein a drain of the fifth NMOS transistor is connected to the drain of the fourth PMOS transistor and a gate of the fifth NMOS transistor is connected to the complementary input port; and wherein the operation controller comprises a sixth NMOS transistor, wherein a drain of the sixth NMOS transistor is connected to the sources of the second NMOS transistor, the third NMOS transistor, the fourth NMOS transistor, the fifth NMOS transistor, and the output voltage mean value controller.

29. A full differential amplifier comprising:

an input port, a complementary input port, an output port, and a complementary output port;

a first differential amplifying unit, wherein the first differential amplifying unit increases a voltage at the output port when a voltage at the input port is larger than a voltage at the complementary input port, and reduces the voltage at the output port when the voltage at the input port is lower than the voltage at the complementary input port;

a second differential amplifying unit, wherein the second differential amplifying unit reduces a voltage at the complementary output port when the voltage at the input port is larger than the voltage at the complementary input port, and increases the voltage at the complementary output port when the voltage at the input port is lower than the voltage at the complementary input port; and an output voltage level control circuit connected between the output port and the complementary output port, wherein the output voltage level control circuit controls the voltages at the output port and the complementary output port, the output voltage level control circuit comprising:

an output voltage mean value sensing unit, wherein the mean value sensing unit senses a mean value of the voltages at the output port and at the complementary output port, the mean value sensing unit comprising a first resistor and a second resistor serially connected between the output port and the complementary output port, wherein the voltage mean value is output from a node between the first and second resistors; and an output mean value controller, wherein the mean value controller prevents the voltage mean value from increasing to more than a predetermined value, the mean value controller comprising a first NMOS transistor comprising a first source, a first gate, and a first drain, and a second NMOS transistor comprising a second source, a second gate, and a second drain, wherein the first and second gates are coupled to the node between the first and second resistors, the first drain is coupled to the output port, the second drain is coupled to the complementary output port, and the first source and the second source are coupled to a ground.

30. The full differential amplifier of claim 29, further comprising an operation controller connected to the first differential amplifying unit, the second differential amplifying unit, and the output voltage level control circuit, wherein the operation controller controls the operation of the first differential amplifying unit, the second differential amplifying unit, and the output voltage level control circuit according to an enable signal.

31. The full differential amplifier of claim 30, wherein the first differential amplifying unit comprises:

a first PMOS transistor, wherein a supply voltage is applied to a source of the first PMOS transistor, and a drain and a gate of the first PMOS transistor are connected;

a second PMOS transistor, wherein the supply voltage is applied to a source of the second PMOS transistor, a gate of the second PMOS transistor is connected to the gate of the first PMOS transistor, and a drain of the second PMOS transistor is connected to the output port;

a second NMOS transistor, wherein a gate of the first NMOS transistor is connected to the input port and a drain of the first NMOS transistor is connected to the drain of the first PMOS transistor; and a third NMOS transistor, wherein a gate of the second NMOS transistor is connected to the complementary input port and a drain of the second NMOS transistor is connected to the output port;

wherein the second differential amplifying unit comprises:

a third PMOS transistor, wherein the supply voltage is applied to the source of the third PMOS transistor, and the drain of the third PMOS transistor is connected to the complementary output port;

a fourth PMOS transistor, wherein the supply voltage is applied to a source of the fourth PMOS transistor, a drain and a gate of the fourth PMOS transistor are connected, and the gate of the fourth PMOS transistor is connected to the gate of the third PMOS transistor;

a fourth NMOS transistor wherein a gate of the fourth NMOS transistor is connected to the input port and a drain of the fourth NMOS transistor is connected to the complementary output port; and a fifth NMOS transistor wherein a drain of the fifth NMOS transistor is connected to the drain of the fourth PMOS transistor and a gate of the fifth NMOS transistor is connected to the complementary input port; and wherein the operation controller comprises a sixth NMOS transistor, wherein a drain of the sixth NMOS transistor is connected to the sources of the second NMOS transistor, the third NMOS transistor, the fourth NMOS transistor, the fifth NMOS transistor, and the output voltage mean value controller.

32. The full differential amplifier of claim 29, wherein the first and second resistors are approximately equal resistance.

* * * * *